(12) United States Patent
Wang et al.

(10) Patent No.: US 10,924,118 B1
(45) Date of Patent: Feb. 16, 2021

(54) POSITIVE FEEDBACK XOR/XNOR GATE AND LOW-DELAY HYBRID LOGIC ADDER

(71) Applicant: Ningbo University, Zhejiang (CN)

(72) Inventors: Pengjun Wang, Zhejiang (CN); Shunxin Ye, Zhejiang (CN); Yuejun Zhang, Zhejiang (CN); Huihong Zhang, Zhejiang (CN); Xiaotian Zhang, Zhejiang (CN)

(73) Assignee: Ningbo University, Zhejiang (CN)

( * ) Notice: Subject to any disclaimer, the term of this patent is extended or adjusted under 35 U.S.C. 154(b) by 0 days.

(21) Appl. No.: 17/078,100

(22) Filed: Oct. 23, 2020

(30) Foreign Application Priority Data

Feb. 21, 2020 (CN) .......................... 2020 1 0106248

(51) Int. Cl.
*H03K 19/21* (2006.01)
*G06F 7/501* (2006.01)
*H03K 19/003* (2006.01)
*H03K 19/017* (2006.01)

(52) U.S. Cl.
CPC .......... *H03K 19/215* (2013.01); *G06F 7/501* (2013.01); *H03K 19/00323* (2013.01); *H03K 19/01742* (2013.01)

(58) Field of Classification Search
CPC .............. G06F 7/501; H03K 19/00323; H03K 19/01742; H03K 19/21; H03K 19/215
See application file for complete search history.

(56) References Cited

U.S. PATENT DOCUMENTS

| | | | | |
|---|---|---|---|---|
| 4,417,161 A | * | 11/1983 | Uya ..................... | H03K 19/215 326/54 |
| 5,334,888 A | * | 8/1994 | Bodas .................. | H03K 19/215 326/52 |
| 6,265,923 B1 | * | 7/2001 | Amir ..................... | H03K 3/037 327/211 |
| 7,271,703 B2 | * | 9/2007 | Lee ........................... | G06F 7/02 326/54 |
| 2012/0079331 A1 | * | 3/2012 | Toda ..................... | G11C 7/1006 714/719 |

* cited by examiner

*Primary Examiner* — Kurtis R Bahr
(74) *Attorney, Agent, or Firm* — JCIPRNET (57) ABSTRACT

A positive feedback XOR/XNOR gate and a low-delay hybrid logic adder are provided. The low-delay hybrid logic adder comprises the positive feedback XOR/XNOR gate and an output circuit. The positive feedback XOR/XNOR gate comprises a first PMOS transistor and a second PMOS transistor used as pass transistors, a first NMOS transistor and a second NMOS transistor constituting a pull-down network, and a third PMOS transistor, a third NMOS transistor and a fourth NMOS transistor constituting a positive feedback loop. When an XOR logic output terminal of the positive feedback XOR/XNOR gate is pulled down below a switching threshold of an inverter formed by the third PMOS transistor and the fourth NMOS transistor, the positive feedback loop starts to operate to enable the XOR logic output terminal of the positive feedback XOR/XNOR gate to enter a pull-down phase to be pulled down to a low level to avoid threshold voltage losses.

4 Claims, 5 Drawing Sheets

POSITIVE FEEDBACK XOR/XNOR GATE AND LOW-DELAY HYBRID LOGIC ADDER

CROSS-REFERENCE TO RELATED APPLICATION

This application claims the priority benefit of China application serial no. 202010106248.1, filed on Feb. 21, 2020. The entirety of the above-mentioned patent application is hereby incorporated by reference herein and made a part of this specification.

TECHNICAL FIELD

The invention relates to an XOR/XNOR gate, in particular to a positive feedback XOR/XNOR gate and a low-delay hybrid logic adder.

DESCRIPTION OF RELATED ART

To guarantee power supply (i.e. an operation voltage) to ultra-large-scale integrated circuits, the power consumption should be low, and to increase the operating speed of the ultra-large-scale integrated circuits, the delay should also be low. Adders are widely applied to logic circuits such as comparators and parity checkers to serve as basic modules. A standard static CMOS adder consists of 28 transistors and is robust against voltage changes and dimension changes of the transistors. However, due to the fact that at least one PMOS transistor and at least one NMOS transistor are connected to each input terminal of the standard static CMOS adder, the input capacitance is increased, and the power-delay product (PDP) is increased, accordingly. On this basis, an improved complementary CMOS adder is designed to effectively decrease the area and delay by means of the self-duality of summation and carry. However, such adder has to be configured with 28 transistors, which leads to excessively high power consumption. A complementary pass logic (CPL) adder consists of 32 transistors and has the advantage of full-swing output. However, on account of a large number of internal complementary nodes, the switching frequency and dynamic power consumption are increased, and threshold losses of the nodes result in excessively high delay and power consumption of the adder. A transmission gate full adder (TGA) consisting of 24 transistors can effectively compensate for threshold losses of pass transistors. However, compared with the pass transistor logic, it is necessary to configure doubled transistors to implement the same circuit function by the transmission gate logic.

To reduce the circuit overhead of adders, a transmission function full adder (TFA) integrating the advantages of the pass transistor logic, the transmission gate logic and the static CMOS logic is put forward to realize a low-power hybrid logic adder free of threshold losses. However, such adder is poor in drive capacity and excessively high in delay. A hybrid logic 14T adder can solve the problem of threshold losses of pass transistors by means of a PMOS transistor and an NMOS transistor which are cross-coupled, and can fulfill full swing of the node voltage; however, the pull-down delay of XOR nodes of a 6TXOR/XNOR gate in the adder and the pull-up delay of XNOR nodes of the 6TXOR/XNOR gate are high.

Figure 1A:
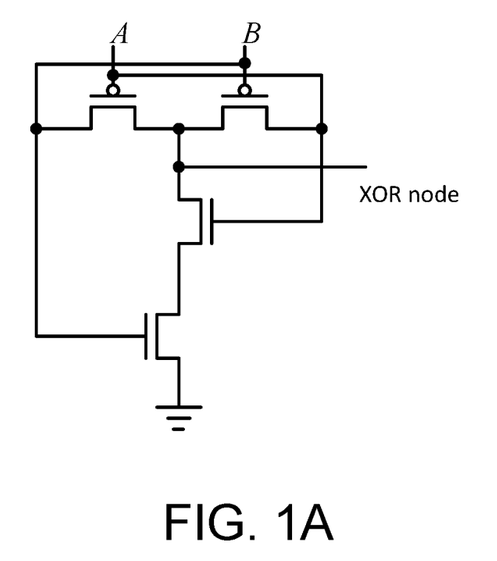
FIG. 1A is a circuit diagram of an existing 4T pass transistor XOR gate.
Figure 1B:
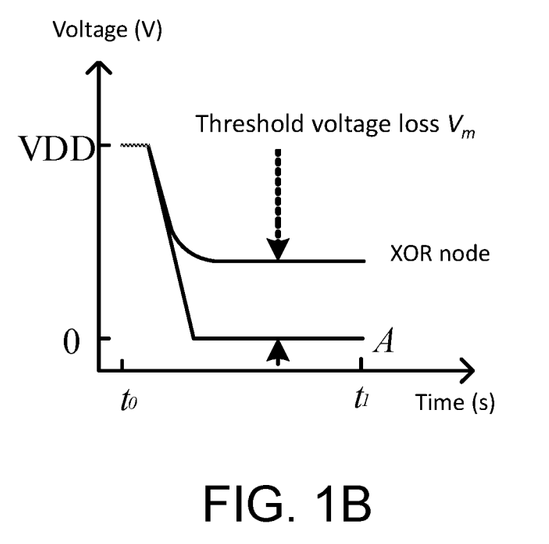
FIG. 1B is a schematic diagram of the threshold loss of the existing 4T pass transistor XOR gate.

The XOR/XNOR gate, as a basic circuit of hybrid logic adders, can generate an XOR signal and an XNOR signal for controlling other circuits to operate. In the circuit design giving priority to the number of transistors, a pass transistor XOR gate can output an XOR signal by means of a few transistors and can output an XNOR signal by means of inverters. FIG. 1A illustrates a 4T pass transistor XOR gate, and a schematic diagram of the threshold loss of the 4T pass transistor XOR gate is shown by FIG. 1B. The 4T pass transistor XOR gate can realize the basic function by means of very few transistors, but the XOR node has a threshold voltage loss $V_m$ in the case of input signal B=0 and input signal A=VDD→0. Thus, the delay and PDP of an adder adopting the 4T pass transistor XOR gate will be increased.

BRIEF SUMMARY OF THE INVENTION

One technical issue to be settled by the invention is to provide a positive feedback XOR/XNOR gate free of threshold voltage losses.

The technical solution adopted by the invention to settle the aforesaid technical issue is as follows: a positive feedback XOR/XNOR gate comprises a first PMOS transistor, a second PMOS transistor, a third PMOS transistor, a first NMOS transistor, a second NMOS transistor, a third NMOS transistor and a fourth NMOS transistor, wherein a gate of the first PMOS transistor, a drain of the second PMOS transistor and a gate of the first NMOS transistor are connected, a connecting terminal is a first input terminal of the positive feedback XOR/XNOR gate, and a first input signal is provided to the first input terminal of the positive feedback XOR/XNOR gate; a source of the first PMOS transistor, a source of the second PMOS transistor, a drain of the first NMOS transistor, a gate of the third PMOS transistor, a gate of the third NMOS transistor and a drain of the fourth NMOS transistor are connected, a connecting terminal is an XOR logic output terminal of the positive feedback XOR/XNOR gate, and the XOR logic output terminal of the positive feedback XOR/XNOR gate outputs an XOR logic value; a gate of the second PMOS transistor, a drain of the first PMOS transistor and a gate of the second NMOS transistor are connected, a connecting terminal is a second input terminal of the positive feedback XOR/XNOR gate, and a second input signal is provided to the second input terminal of the positive feedback XOR/XNOR gate; an operation voltage is provided to a source of the third PMOS transistor; a drain of the third PMOS transistor, a drain of the third NMOS transistor and a gate of the fourth NMOS transistor are connected, a connecting terminal is an XNOR logic output terminal of the positive feedback XOR/XNOR gate, and the XNOR logic output terminal of the positive feedback XOR/XNOR gate outputs an XNOR logic value; a source of the first NMOS transistor and a drain of the second NMOS transistor are connected; and a source of the second NMOS transistor, a source of the third NMOS transistor and a source of the fourth NMOS transistor are grounded.

Another technical issue to be settled by the invention is to provide a low-delay hybrid logic adder, which is free of threshold voltage losses and small in delay and PDP.

The technical solution adopted by the invention to settle the second technical issue is as follows: a low-delay hybrid logic adder comprises a positive feedback XOR/XNOR gate and an output circuit for outputting a sum signal and a carry signal to an upper bit, wherein the positive feedback XOR/XNOR gate has a first input terminal, a second input terminal, an XOR logic output terminal and an XNOR logic output terminal, the output circuit has a first input terminal, a second input terminal, a third input terminal, a fourth input terminal, a first output terminal and a second output terminal, a first input signal is provided to the first input terminal of the positive feedback XOR/XNOR gate, a second input signal is provided to the second input terminal of the positive feedback XOR/XNOR gate, the first input terminal of the output circuit is connected to the XOR logic output terminal of the positive feedback XOR/XNOR gate, the second input terminal of the output circuit is connected to the XNOR logic output terminal of the positive feedback XOR/XNOR gate, the first input terminal of the positive feedback XOR/XNOR gate is a first input terminal of the low-delay hybrid logic adder, the second input terminal of the positive feedback XOR/XNOR gate is a second input terminal of the low-delay hybrid logic adder, the third input terminal of the output circuit is a carry input terminal of the low-delay hybrid logic adder, a lower-bit carry signal is provided to the carry input terminal of the low-delay hybrid logic adder, the fourth input terminal of the output circuit is connected to the second input terminal of the positive feedback XOR/XNOR gate, the first output terminal of the output circuit is a sum output terminal of the low-delay hybrid logic adder, the sum output terminal of the low-delay hybrid logic adder outputs a sum signal, the second output terminal of the output circuit is a carry output terminal of the low-delay hybrid logic adder, and the carry output terminal of the low-delay hybrid logic adder outputs a carry signal to the upper bit. The positive XOR/XNOR gate comprises a first PMOS transistor, a second PMOS transistor, a third PMOS transistor, a first NMOS transistor, a second NMOS transistor, a third NMOS transistor and a fourth NMOS transistor, wherein a gate of the first PMOS transistor, a drain of the second PMOS transistor and a gate of the first NMOS transistor are connected, and a connecting terminal is the first input terminal of the positive feedback XOR/XNOR gate; a source of the first PMOS transistor, a source of the second PMOS transistor, a drain of the first NMOS transistor, a gate of the third PMOS transistor, a gate of the third NMOS transistor and a drain of the fourth NMOS transistor are connected, a connecting terminal is the XOR logic output terminal of the positive feedback XOR/XNOR gate, and the XOR logic output terminal of the positive feedback XOR/XNOR gate outputs an XOR logic value; a gate of the second PMOS transistor, a drain of the first PMOS transistor and a gate of the second NMOS transistor are connected, and a connecting terminal is the second input terminal of the positive feedback XOR/XNOR gate; an operation voltage is provided to a source of the third PMOS transistor; a drain of the third PMOS transistor, a drain of the third NMOS transistor and a gate of the fourth NMOS transistor are connected, a connecting terminal is the XNOR logic output terminal of the positive feedback XOR/XNOR gate, and the XNOR logic output terminal of the positive feedback XOR/XNOR gate outputs an XNOR logic value; a source of the first NMOS transistor is connected to a drain of the second NMOS transistor; and a source of the second NMOS transistor, a source of the third NMOS transistor and a source of the fourth NMOS transistor are grounded;

The output circuit comprises a fourth PMOS transistor, a fifth PMOS transistor, a sixth PMOS transistor, a seventh PMOS transistor, a fifth NMOS transistor, a sixth NMOS transistor, a seventh NMOS transistor and an eighth NMOS transistor, wherein a gate of the fourth PMOS transistor, a source of the fifth PMOS transistor, a gate of the seventh NMOS transistor and a gate of the seventh PMOS transistor are connected, and a connecting terminal is the first input terminal of the output circuit; a source of the fourth PMOS transistor, a source of the fifth NMOS transistor, a source of the sixth PMOS transistor, a source of the seventh NMOS transistor, a gate of the fifth PMOS transistor and a gate of the sixth NMOS transistor are connected, and a connecting terminal is the third input terminal of the output circuit; a drain of the fourth PMOS transistor, a drain of the fifth NMOS transistor, a drain of the fifth PMOS transistor and a drain of the sixth NMOS transistor are connected, and a connecting terminal is the first output terminal of the output circuit; a gate of the fifth NMOS transistor, a gate of the sixth PMOS transistor, a source of the sixth NMOS transistor and a gate of the eighth NMOS transistor are connected, and a connecting terminal is the second input terminal of the output circuit; a drain of the sixth PMOS transistor, a drain of the seventh NMOS transistor, a drain of the seventh PMOS transistor and a drain of the eighth NMOS transistor are connected, and a connecting terminal is the second output terminal of the output circuit; and a source of the seventh PMOS transistor and a source of the eighth NMOS transistor are connected, and a connecting terminal is the fourth input terminal of the output circuit. An XNOR logic value XNOR output by the XNOR logic output terminal of the positive feedback XOR/XNOR gate is provided to the second input terminal of the output circuit, and an XOR logic value XOR output by the XOR logic output terminal of the positive feedback XOR/XNOR gate is provided to the first input terminal of the output circuit; when XNOR=VDD (power supply) and XOR=0, a transmission gate formed by the fourth PMOS transistor and the fifth NMOS transistor is turned on, a sum signal SUM output by the first output terminal of the output circuit is equivalent to a lower-bit carry signal CIN provided to a third input terminal of an output circuit, a transmission gate formed by the sixth PMOS transistor and the seventh NMOS transistor is turned off, a transmission gate formed by the seventh PMOS transistor and the eighth NMOS transistor is turned on, the second output terminal and the fourth input terminal of the output circuit are connected, and a carry signal COUT output by the second output terminal of the output circuit is equivalent to a signal provided to the fourth input terminal of the output circuit (namely, the second input signal B provided to the second input terminal of the positive feedback XOR/NXOR gate); and when XNOR=0 and XOR=VDD, the transmission gate formed by the fourth PMOS transistor and the fifth NMOS transistor is turned off, an inverter formed by the fifth PMOS transistor and the sixth NMOS transistor operates, the sum signal SUM output by the first output terminal of the output circuit is equivalent to an inverted signal of the carry signal CIN provided to the third input terminal of the output circuit, the transmission gate formed by the sixth PMOS transistor and the seventh NMOS transistor is turned on, the transmission gate formed by the seventh PMOS transistor and the eighth NMOS transistor is turned off, the second output terminal and the third input terminal of the output circuit are connected, and the carry signal COUT output by the second output terminal of the output circuit is equivalent to the carry signal CIN provided to the third input terminal of the output circuit. It can thus be seen that the output circuit has the delay of only one transmission gate or inverter when performing input or output under the two input circumstances, thus greatly reducing the delay of the entire circuit of the low-delay hybrid logic adder.

The output circuit further has a fifth input terminal and comprises a fourth PMOS transistor, a fifth PMOS transistor, a sixth PMOS transistor, a seventh PMOS transistor, an eighth PMOS transistor, a ninth PMOS transistor, a tenth PMOS transistor, an eleventh PMOS transistor, a fifth NMOS transistor, a sixth NMOS transistor, a seventh NMOS transistor, an eighth NMOS transistor, a ninth NMOS transistor, a tenth NMOS transistor, an eleventh NMOS transistor and a twelfth NMOS transistor, wherein a gate of the fourth PMOS transistor, a source of the sixth PMOS transistor and a gate of the eighth PMOS transistor are connected, and a connecting terminal is the second input terminal of the output circuit; a source of the fourth PMOS transistor, a source of the fifth NMOS transistor, a gate of the sixth NMOS transistor, a gate of the sixth PMOS transistor, a gate of the seventh PMOS transistor and a gate of the ninth NMOS transistor are connected, and a connecting terminal is the third input terminal of the output circuit; a drain of the fourth PMOS transistor, a drain of the fifth NMOS transistor, a drain of the sixth NMOS transistor, a drain of the sixth PMOS transistor, a gate of the fifth PMOS transistor and a gate of the seventh NMOS transistor are connected; an operation voltage is provided to a source of the fifth PMOS transistor; a drain of the fifth PMOS transistor and a drain of the seventh NMOS transistor are connected, and a connecting terminal is the first output terminal of the output circuit; a source of the seventh NMOS transistor is grounded; an operation voltage is provided to a source of the seventh PMOS transistor, and a drain of the seventh PMOS transistor and a source of the eighth PMOS transistor are connected; a drain of the eighth PMOS transistor, a drain of the eighth NMOS transistor, a drain of the tenth PMOS transistor, a drain of the tenth NMOS transistor, a gate of the eleventh PMOS transistor and a gate of the twelfth NMOS transistor are connected; an operation voltage is provided to a source of the ninth PMOS transistor; a gate of the ninth PMOS transistor and a gate of the eleventh NMOS transistor are connected, and a connecting terminal is the fifth input terminal of the output circuit; the fifth input terminal of the output circuit is connected to the first input terminal of the positive feedback XOR/XNOR gate; a drain of the ninth PMOS transistor and a source of the tenth PMOS transistor are connected; a gate of the tenth PMOS transistor and a gate of the tenth NMOS transistor are connected, and a connecting terminal is the fourth input terminal of the output circuit; an operation voltage is provided to a source of the eleventh PMOS transistor; a drain of the eleventh PMOS transistor and a drain of the twelfth NMOS transistor are connected, and a connecting terminal is the second output terminal of the output circuit; a source of the twelfth NMOS transistor is grounded; a gate of the fifth NMOS transistor, a source of the sixth NMOS transistor and a gate of the eighth NMOS transistor are connected, and a connecting terminal is the first input terminal of the output circuit; a source of the eighth NMOS transistor and a drain of the ninth NMOS transistor are connected; a source of the ninth NMOS transistor is grounded; a source of the tenth NMOS transistor and a drain of the eleventh NMOS transistor are connected; and a source of the eleventh NMOS transistor is grounded. An XNOR logic value XNOR output by the XNOR logic output terminal of the positive feedback XOR/XNOR gate is provided to the second input terminal of the output circuit, and an XOR logic value XOR output by the XOR logic output terminal of the positive feedback XOR/XNOR gate is provided to the first input terminal of the output circuit; when XOR=VDD (power supply) and XNOR=0, the transmission gate formed by the fourth PMOS transistor and the fifth NMOS transistor operates, the sum signal SUM output by the first output terminal of the output circuit is equivalent to the inverted signal of the carry signal CIN provided to the third input terminal of the output circuit by means of an inverter formed by the fifth PMOS transistor and the seventh NMOS transistor, the eighth PMOS transistor and the eighth NMOS transistor are turned on, the ninth PMOS transistor and the tenth PMOS transistor cannot be turned on at the same time (turned on alternately), the tenth NMOS transistor and the eleventh NMOS transistor cannot be turned on at the same time (turned on alternately), an inverter formed by the seventh PMOS transistor and the ninth NMOS transistor operates, and the carry signal COUT output by the second output terminal of the output circuit is equivalent to the carry signal CIN provided to the third input terminal of the output circuit by means of an inverter formed by the eleventh PMOS transistor and the twelfth NMOS transistor; and when XOR=0 and XNOR=VDD, the transmission gate formed by the fourth PMOS transistor and the fifth NMOS transistor is turned off, an inverter formed by the sixth PMOS transistor and the sixth NMOS transistor operates, the sum signal SUM output by the first output terminal of the output circuit is equivalent to the carry signal CIN provided to the third input terminal of the output circuit by means of the inverter formed by the fifth PMOS transistor and the seventh NMOS transistor, the eighth PMOS transistor and the eighth NMOS transistor are turned off, the ninth PMOS transistor and the tenth PMOS transistor are turned on at the same time to form an inverter to operate or the tenth NMOS transistor and the eleventh NMOS transistor are turned on at the same time to form an inverter to operate, and the carry signal COUT output by the second output terminal of the output circuit is equivalent to the signal provided to the fourth input terminal of the output circuit (namely, the second input signal B provided to the second input terminal of the positive feedback XOR/XNOR gate). It can thus be seen that the output circuit has the delay of only one transmission gate and inverter or only one level of buffer when performing input and output under the two input circumstances, thus greatly reducing the delay of the entire circuit of the low-delay hybrid logic adder and improving the drive capacity.

DETAILED DESCRIPTION OF THE INVENTION

The invention discloses a positive feedback XOR/XNOR gate, which is further expounded below in conjunction with the accompanying drawings and embodiments.

Figure 2:
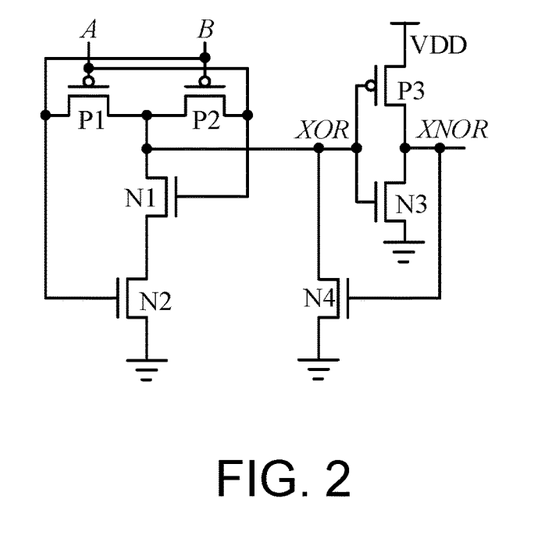
FIG. 2 is a circuit diagram of a positive feedback XOR/XNOR gate of the invention.

Embodiment: As shown in FIG. 2, a positive feedback XOR/XNOR gate comprises a first PMOS transistor P1, a second PMOS transistor P2, a third PMOS transistor P3, a first NMOS transistor N1, a second NMOS transistor N2, a third NMOS transistor N3 and a fourth NMOS transistor N4, wherein a gate of the first PMOS transistor P1, a drain of the second PMOS transistor P2 and a gate of the first NMOS transistor N1 are connected at a first input terminal of the positive feedback XOR/XNOR gate, and a first input signal A is provided to the first input terminal of the positive feedback XOR/XNOR gate; a source of the first PMOS transistor P1, a source of the second PMOS transistor P2, a drain of the first NMOS transistor N1, a gate of the third PMOS transistor P3, a gate of the third NMOS transistor N3 and a drain of the fourth NMOS transistor N4 are connected at an XOR logic output terminal of the positive feedback XOR/XNOR gate, and the XOR logic output terminal of the positive feedback XOR/XNOR gate outputs an XOR logic value XOR; a gate of the second PMOS transistor P2, a drain of the first PMOS transistor P1 and a gate of the second NMOS transistor N2 are connected at a second input terminal of the positive feedback XOR/XNOR gate, and a second input signal B is provided to the second input terminal of the positive feedback XOR/XNOR gate; an operation voltage VDD is provided to a source of the third PMOS transistor P3; a drain of the third PMOS transistor P3, a drain of the third NMOS transistor N3 and a gate of the fourth NMOS transistor N4 are connected at an XNOR logic output terminal of the positive feedback XOR/XNOR gate, and the XNOR logic output terminal of the positive feedback XOR/XNOR gate outputs an XNOR logic value XNOR; a source of the first NMOS transistor N1 and a drain of the second NMOS transistor N2 are connected; and a source of the second NMOS transistor N2, a source of the third NMOS transistor N3 and a source of the fourth NMOS transistor N4 are grounded.

Figure 3:
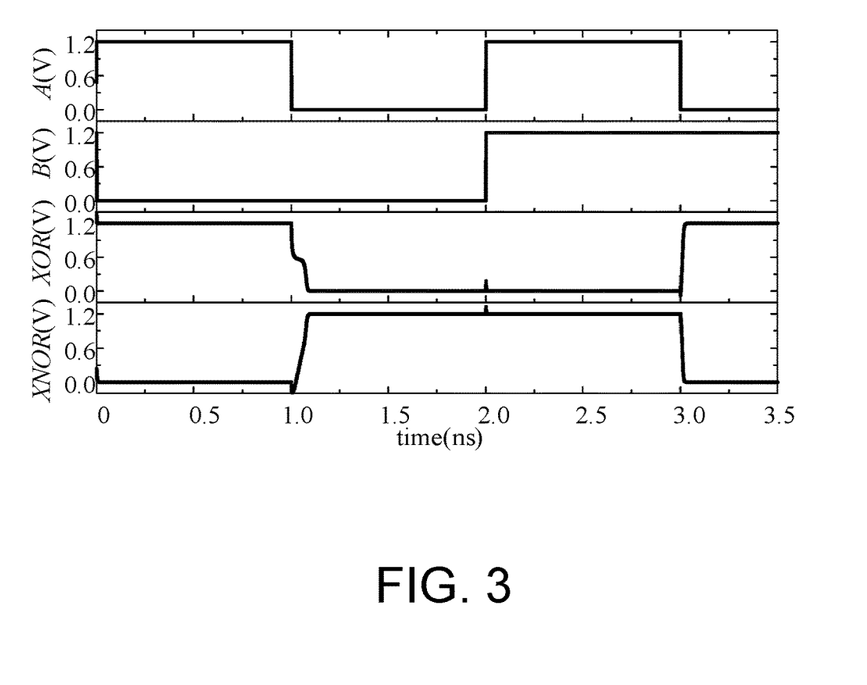
FIG. 3 is a simulated diagram of the logic function of the positive feedback XOR/XNOR gate of the invention.
Figure 4:
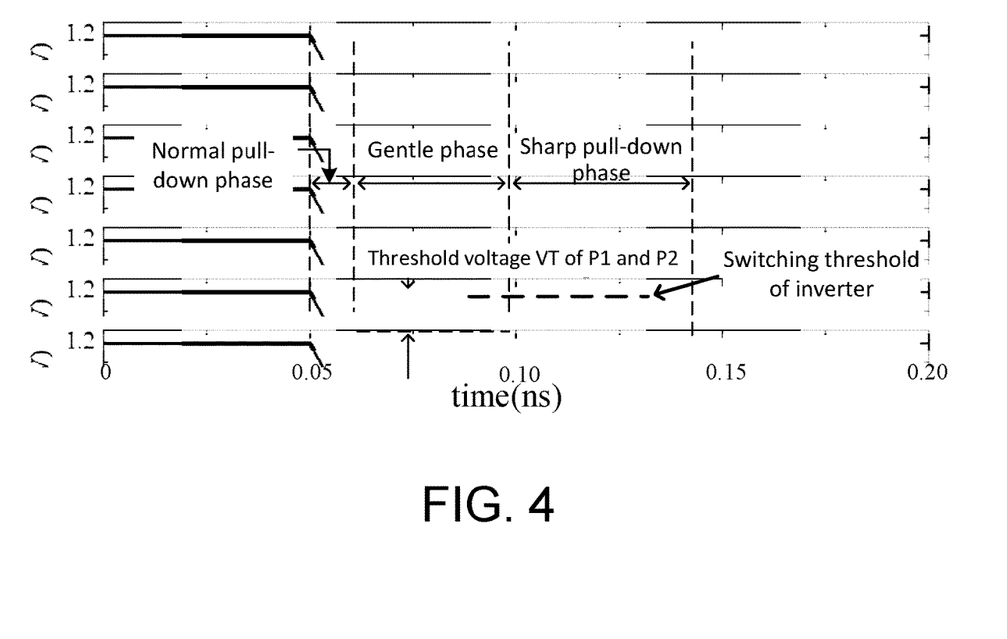
FIG. 4 is a segmented pull-down diagram of the level of an XOR output terminal of the positive feedback XOR/XNOR gate of the invention.

FIG. 3 illustrates a simulated diagram of the logic function of the positive feedback XOR/XNOR gate of the invention. As can be seen by analyzing FIG. 3, the operating simulation waveform of the positive feedback XOR/XNOR gate of the invention is correct, that is to way, the positive feedback XOR/XNOR gate has a correct logic function. FIG. 4 illustrates a segmented pull-down diagram of the level of the XOR output terminal of the positive feedback XOR/XNOR gate of the invention. As can be seen by analyzing FIG. 4, the positive feedback XOR/XNOR gate of the invention is free of threshold voltage losses.

Compared with the prior art, the positive feedback XOR/XNOR gate of the invention has the following advantages: the positive feedback XOR/XNOR gate is formed by the first PMOS transistor, the second PMOS transistor, the third PMOS transistor, the first NMOS transistor, the second NMOS transistor, the third NMOS transistor and the fourth NMOS transistor, a pull-down network is formed by the first NMOS transistor and the second NMOS transistor, the first PMOS transistor and the second PMOS transistor are pass transistors, and a positive feedback loop is formed by the third PMOS transistor, the third NMOS transistor and the fourth NMOS transistor; when the first input signal A accessed to the first input terminal of the positive feedback XOR/XNOR gate meets A=VDD (power supply) and the second input signal B accessed to the second input terminal of the positive feedback XOR/XNOR gate meets B=VDD, the first PMOS transistor and the second PMOS transistor will be turned off at the same time, the second input signal B accessed to the drain of the first PMOS transistor cannot be normally transmitted to the source of the first PMOS transistor, the first input signal A accessed to the drain of the second PMOS transistor cannot be normally transmitted to the source of the second PMOS transistor, the first NMOS transistor and the second NMOS transistor are turned on at the same time, and the level of the XOR logic output terminal of the positive feedback XOR/XNOR gate is pulled down to a low level; when the first input signal A accessed to the first input terminal of the positive feedback XOR/XNOR gate hops to 0 from VDD and the second input terminal B accessed to the second input terminal of the positive feedback XOR/XNOR gate meets B=0, the level of the XOR logic output terminal of the positive feedback XOR/XNOR gate will be pulled down normally for a period of time along with the hopping of the first input signal A; when the first input signal A hops close to a threshold voltage VT of the first PMOS transistor and the second PMOS transistor, the level of the XOR logic output terminal of the positive feedback XOR/XNOR gate will enter into a gentle phase; when the level of the XOR logic output terminal of the positive feedback XOR/XNOR gate is pulled down below a switching threshold of an inverter formed by the third PMOS transistor and the fourth NMOS transistor, the positive feedback loop formed by the third PMOS transistor, the third NMOS transistor and the fourth NMOS transistor starts to operate to enable the level of the XOR logic output terminal of the positive feedback XOR/XNOR gate to enter into a sharp pull-down phase to be pulled to a low level to avoid threshold voltage losses. Therefore, the positive feedback XOR/XNOR gate of the invention is free of threshold voltage losses.

The invention further discloses a low-delay hybrid logic adder implemented by means of the positive feedback XOR/XNOR gate mentioned above. The low-delay hybrid logic adder of the invention is further expounded below in conjunction with the accompanying drawings and embodiments.

Figure 5:
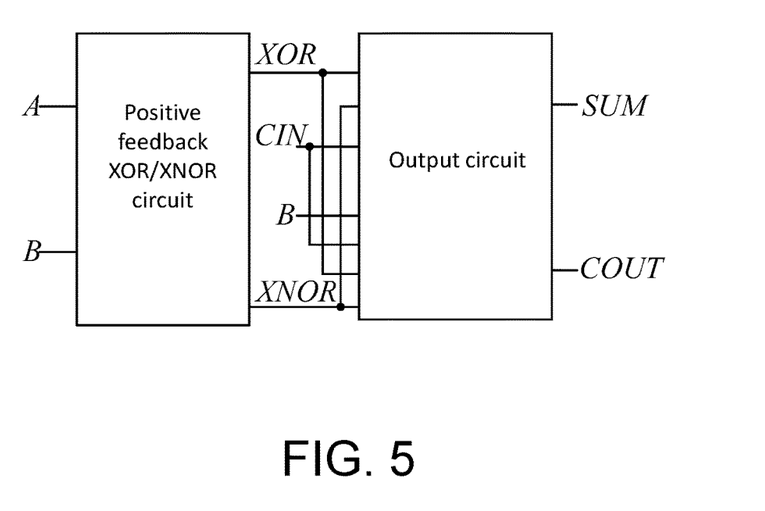
FIG. 5 is a structural block diagram of a low-delay hybrid logic adder of the invention.
Figure 6:
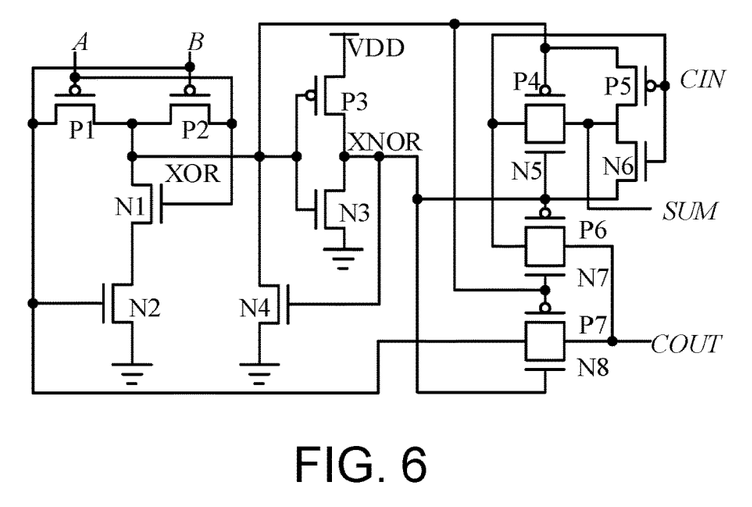
FIG. 6 is a circuit diagram of Embodiment 1 of the low-delay hybrid logic adder of the invention.

Embodiment 1: As shown in FIG. 5 and FIG. 6, a low-delay hybrid logic adder comprises a positive feedback XOR/XNOR gate and an output circuit for outputting a sum signal and a carry signal to an upper bit, wherein the positive feedback XOR/XNOR gate has a first input terminal, a second input terminal, an XOR logic output terminal and an XNOR logic output terminal, the output circuit has a first input terminal, a second input terminal, a third input terminal, a fourth input terminal, a first output terminal and a second output terminal, a first input signal A is provided to the first input terminal of the positive feedback XOR/XNOR gate, a second input signal B is provided to the second input terminal of the positive feedback XOR/XNOR gate, the first input terminal of the output circuit is connected to the XOR logic output terminal of the positive feedback XOR/XNOR gate, the second input terminal of the output circuit is connected to the XNOR logic output terminal of the positive feedback XOR/XNOR gate, the first input terminal of the positive feedback XOR/XNOR gate is a first input terminal of the low-delay hybrid logic adder, the second input terminal of the positive feedback XOR/XNOR gate is a second input terminal of the low-delay hybrid logic adder, the third input terminal of the output circuit is a carry input terminal of the low-delay hybrid logic adder, a lower-bit carry signal CIN is provided to the carry input terminal of the low-delay hybrid logic adder, the fourth input terminal of the output circuit is connected to the second input terminal of the positive feedback XOR/XNOR gate, the first output terminal of the output circuit is a sum output terminal of the low-delay hybrid logic adder, the sum output terminal of the low-delay hybrid logic adder outputs a sum signal SUM, the second output terminal of the output circuit is a carry output terminal of the low-delay hybrid logic adder, and the carry output terminal of the low-delay hybrid logic adder outputs a carry signal COUT to the upper bit. The positive XOR/XNOR gate comprises a first PMOS transistor P1, a second PMOS transistor P2, a third PMOS transistor P3, a first NMOS transistor N1, a second NMOS transistor N2, a third NMOS transistor N3 and a fourth NMOS transistor N4, wherein a gate of the first PMOS transistor P1, a drain of the second PMOS transistor P2 and a gate of the first NMOS transistor N1 are connected, and a connecting terminal is the first input terminal of the positive feedback XOR/XNOR gate; a source of the first PMOS transistor P1, a source of the second PMOS transistor P2, a drain of the first NMOS transistor N1, a gate of the third PMOS transistor P3, a gate of the third NMOS transistor N3 and a drain of the fourth NMOS transistor N4 are connected at the XOR logic output terminal of the positive feedback XOR/XNOR gate, and the XOR logic output terminal of the positive feedback XOR/XNOR gate outputs an XOR logic value XOR; a gate of the second PMOS transistor P2, a drain of the first PMOS transistor P1 and a gate of the second NMOS transistor N2 are connected, and a connecting terminal is the second input terminal of the positive feedback XOR/XNOR gate; an operation voltage VDD is provided to a source of the third PMOS transistor P3; a drain of the third PMOS transistor P3, a drain of the third NMOS transistor N3 and a gate of the fourth NMOS transistor N4 are connected at the XNOR logic output terminal of the positive feedback XOR/XNOR gate, and the XNOR logic output terminal of the positive feedback XOR/XNOR gate outputs an XNOR logic value XNOR; a source of the first NMOS transistor N1 is connected to a drain of the second NMOS transistor N2; and a source of the second NMOS transistor N2, a source of the third NMOS transistor N3 and a source of the fourth NMOS transistor N4 are grounded. The output circuit comprises a fourth PMOS transistor P4, a fifth PMOS transistor P5, a sixth PMOS transistor P6, a seventh PMOS transistor P7, a fifth NMOS transistor N5, a sixth NMOS transistor N6, a seventh NMOS transistor N7 and an eighth NMOS transistor N8, wherein a gate of the fourth PMOS transistor P4, a source of the fifth PMOS transistor P5, a gate of the seventh NMOS transistor N7 and a gate of the seventh PMOS transistor P7 are connected, and a connecting terminal is the first input terminal of the output circuit; a source of the fourth PMOS transistor P4, a source of the fifth NMOS transistor N5, a source of the sixth PMOS transistor P6, a source of the seventh NMOS transistor N7, a gate of the fifth PMOS transistor P5 and a gate of the sixth NMOS transistor N6 are connected, and a connecting terminal is the third input terminal of the output circuit; a drain of the fourth PMOS transistor P4, a drain of the fifth NMOS transistor N5, a drain of the fifth PMOS transistor P5 and a drain of the sixth NMOS transistor N6 are connected, and a connecting terminal is the first output terminal of the output circuit; a gate of the fifth NMOS transistor N5, a gate of the sixth PMOS transistor P6, a source of the sixth NMOS transistor N6 and a gate of the eighth NMOS transistor N8 are connected, and a connecting terminal is the second input terminal of the output circuit; a drain of the sixth PMOS transistor P6, a drain of the seventh NMOS transistor N7, a drain of the seventh PMOS transistor P7 and a drain of the eighth NMOS transistor N8 are connected, and a connecting terminal is the second output terminal of the output circuit; and a source of the seventh PMOS transistor P7 and a source of the eighth NMOS transistor N8 are connected, and a connecting terminal is the fourth input terminal of the output circuit.

Figure 7:
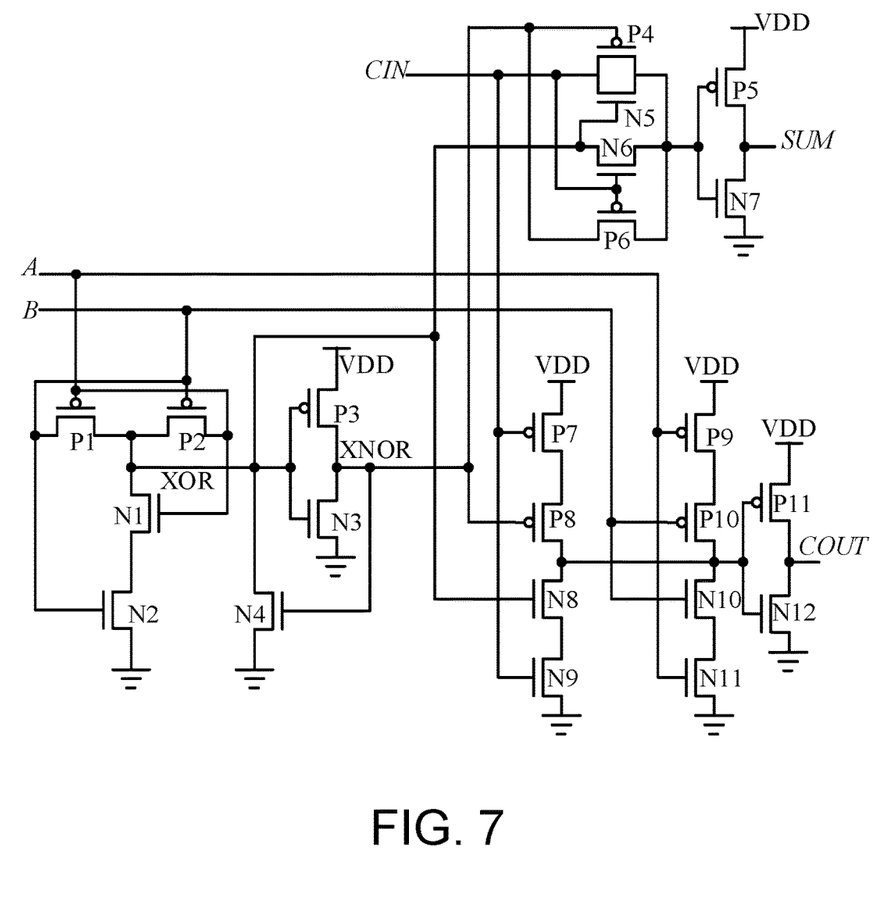
FIG. 7 is a circuit diagram of Embodiment 2 of the low-delay hybrid logic adder of the invention of the invention.

Embodiment 2: As shown in FIG. 7, a low-delay hybrid logic adder comprises a positive feedback XOR/XNOR gate and an output circuit for outputting a sum signal and a carry signal to an upper bit, wherein the positive feedback XOR/XNOR gate has a first input terminal, a second input terminal, an XOR logic output terminal and an XNOR logic output terminal, the output circuit has a first input terminal, a second input terminal, a third input terminal, a fourth input terminal, a fifth input terminal, a first output terminal and a second output terminal, a first input signal A is provided to the first input terminal of the positive feedback XOR/XNOR gate, a second input signal B is provided to the second input terminal of the positive feedback XOR/XNOR gate, the first input terminal of the output circuit is connected to XOR logic output terminal of the positive feedback XOR/XNOR gate, the second input terminal of the output circuit is connected to the XNOR logic output terminal of the positive feedback XOR/XNOR gate, the first input terminal of the positive feedback XOR/XNOR gate is a first input terminal of the low-delay hybrid logic adder, the second input terminal of the positive feedback XOR/XNOR gate is a second input terminal of the low-delay hybrid logic adder, the third input terminal of the output circuit is a carry input terminal of the low-delay hybrid logic adder, a lower-bit carry signal CIN is provided to the carry input terminal of the low-delay hybrid logic adder, the fourth input terminal of the output circuit is connected to the second input terminal of the positive feedback XOR/XNOR gate, the first output terminal of the output circuit is a sum output terminal of the low-delay hybrid logic adder, the sum output terminal of the low-delay hybrid logic adder outputs a sum signal SUM, the second output terminal of the output circuit is a carry output terminal of the low-delay hybrid logic adder, and the carry output terminal of the low-delay hybrid logic adder outputs a carry signal COUT to an upper bit. The positive feedback XOR/XNOR gate comprises a first PMOS transistor P1, a second PMOS transistor P2, a third PMOS transistor P3, a first NMOS transistor N1, a second NMOS transistor N2, a third NMOS transistor N3 and a fourth NMOS transistor N4, wherein a drain of the second PMOS transistor P2 and a gate of the first NMOS transistor N1 are connected, and a connecting terminal is the first input terminal of the positive feedback XOR/XNOR gate; a source of the first PMOS transistor P1, a source of the second PMOS transistor P2, a drain of the first NMOS transistor N1, a gate of the third PMOS transistor P3, a gate of the third NMOS transistor N3 and a drain of the fourth NMOS transistor N4 are connected at the XOR logic output terminal of the positive feedback XOR/XNOR gate, and the XOR logic output terminal of the positive feedback XOR/XNOR gate outputs an XOR logic value XOR; a gate of the second PMOS transistor P2, a drain of the first PMOS transistor P1 and a gate of the second NMOS transistor N2 are connected, and a connecting terminal is the second input terminal of the positive feedback XOR/XNOR gate; an operation voltage VDD is provided to a source of the third PMOS transistor P3; a drain of the third PMOS transistor P3, a drain of the third NMOS transistor N3 and a gate of the fourth NMOS transistor N4 are connected at the XNOR output terminal of the positive feedback XOR/XNOR gate, and the XNOR output terminal of the positive feedback XOR/XNOR gate outputs an XNOR logic value XNOR; a source of the first NMOS transistor N1 and a drain of the second NMOS transistor N2 are connected; and a source of the second NMOS transistor N2, a source of the third NMOS transistor N3 and a source of the fourth NMOS transistor N4 are grounded. The output circuit comprises a fourth PMOS transistor P4, a fifth PMOS transistor P5, a sixth PMOS transistor P6, a seventh PMOS transistor P7, an eighth PMOS transistor P8, a ninth PMOS transistor P9, a tenth PMOS transistor P10, an eleventh PMOS transistor P11, a fifth NMOS transistor N5, a sixth NMOS transistor N6, a seventh NMOS transistor N7, an eighth NMOS transistor N8, a ninth NMOS transistor N9, a tenth NMOS transistor N10, an eleventh NMOS transistor N11 and a twelfth NMOS transistor N12, wherein a gate of the fourth PMOS transistor P4, a source of the sixth PMOS transistor P6 and a gate of the eighth PMOS transistor P8 are connected, and a connecting terminal is the second input terminal of the output circuit; a source of the fourth PMOS transistor P4, a source of the fifth NMOS transistor N5, a gate of the sixth NMOS transistor N6, a gate of the sixth PMOS transistor P6, a gate of the seventh PMOS transistor P7 and a gate of the ninth NMOS transistor N9 are connected, and a connecting terminal is the third input terminal of the output circuit; a drain of the fourth PMOS transistor P4, a drain of the fifth NMOS transistor N5, a drain of the sixth NMOS transistor N6, a drain of the sixth PMOS transistor P6, a gate of the fifth PMOS transistor P5 and a gate of the seventh NMOS transistor N7 are connected; a power supply is provided to a source of the fifth PMOS transistor P5; a drain of the fifth PMOS transistor P5 and a drain of the seventh NMOS transistor N7 are connected, and a connecting terminal is the first output terminal of the output circuit; a source of the seventh NMOS transistor N7 is grounded; an operation voltage VDD is provided to a source of the seventh PMOS transistor P7, and a drain of the seventh PMOS transistor P7 and a source of the eighth PMOS transistor P8 are connected; a drain of the eighth PMOS transistor P8, a drain of the eighth NMOS transistor N8, a drain of the tenth PMOS transistor P10, a drain of the tenth NMOS transistor N10, a gate of the eleventh PMOS transistor P11 and a gate of the twelfth NMOS transistor N12 are connected; a power supply is provided to a source of the ninth PMOS transistor P9; a gate of the ninth PMOS transistor P9 and a gate of the eleventh NMOS transistor N11 are connected, and a connecting terminal is the fifth input terminal of the output circuit; the fifth input terminal of the output circuit is connected to the first input terminal of the positive feedback XOR/XNOR gate; a drain of the ninth PMOS transistor P9 and a source of the tenth PMOS transistor P10 are connected; a gate of the tenth PMOS transistor P10 and a gate of the tenth NMOS transistor N10 are connected, and a connecting terminal is the fourth input terminal of the output circuit; a power supply is provided to a source of the eleventh PMOS transistor P11; a drain of the eleventh PMOS transistor P11 and a drain of the twelfth NMOS transistor N12 are connected, and a connecting terminal is the second output terminal of the output circuit; a source of the twelfth NMOS transistor N12 is grounded; a gate of the fifth NMOS transistor N5, a source of the sixth NMOS transistor N6 and a gate of the eighth NMOS transistor N8 are connected, and a connecting terminal is the first input terminal of the output circuit; a source of the eighth NMOS transistor N8 and a drain of the ninth NMOS transistor N9 are connected; a source of the ninth NMOS transistor N9 is grounded; a source of the tenth NMOS transistor N10 and a drain of the eleventh NMOS transistor N11 are connected; and a source of the eleventh NMOS transistor N11 is grounded.

Figure 8:
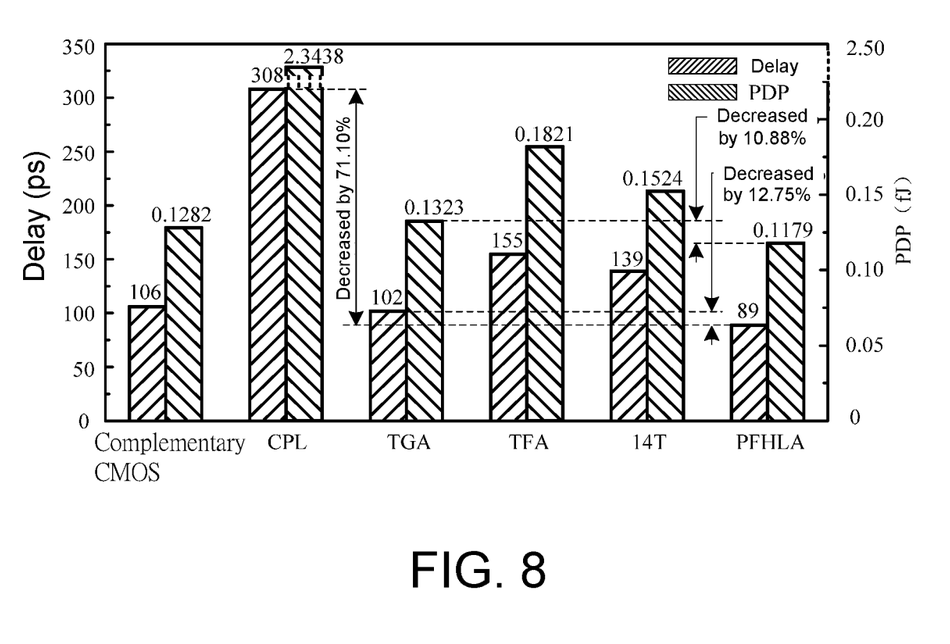
FIG. 8 is a comparison diagram of the delay and PDP of the low-delay hybrid logic adder of the invention and several existing adders.

The delay and PDP of the low-delay hybrid logic adder of the invention are compared with those of several existing adders. Comparison data about the delay and PDP of the low-delay hybrid logic adder of the invention and the several existing adders is shown in FIG. 8. In FIG. 8, PFHLA represents the low-delay hybrid logic adder of the invention, TGA represents an existing TGA, complementary CMOS represents an existing CMOS adder, CPL represents an existing CPL adder, TFA represents an existing TFA, and 14T represents an existing hybrid logic 14T adder. As can be seen by analyzing FIG. 8 that compared with the TGA, the delay of the PFHLA of the invention is decreased by 12.75%, the PDP of the PFHLA of the invention is decreased by 10.88%; compared with the CMOS adder, the delay of the PFHLA of the invention is decreased by 7.86%, and the PDP of the PFHLA of the invention is decreased by 8.73%; compared with the CPL adder, the delay of the PFHLA of the invention is decreased by 246.06%; compared with the TFA adder, the delay of the PFHLA of the invention is decreased by 74.16%, the PDP of the PFHLA of the invention is decreased by 54.45%; and compared with the 14T adder, the delay of the PFHLA of the invention is decreased by 56.18%, the PDP of the PFHLA of the invention is decreased by 29.26%.

Compared with the prior art, the positive feedback XOR/XNOR gate of the invention has the following advantages: the low-delay hybrid logic adder is formed by the positive feedback XOR/XNOR gate and the output circuit for outputting a sum signal and a carry signal to an upper bit; the positive feedback XOR/XNOR gate comprises a first PMOS transistor, a second PMOS transistor, a third PMOS transistor, a first NMOS transistor, a second NMOS transistor, a third NMOS transistor and a fourth NMOS transistor, wherein a pull-down network is formed by the first NMOS transistor and the second NMOS transistor, the first PMOS transistor and the second PMOS transistor are pass transistors, and a positive feedback loop is formed by the third PMOS transistor, the third NMOS transistor and the fourth NMOS transistor; when a first input signal A accessed to the first input terminal of the positive feedback XOR/XNOR gate meets A=VDD and a second input signal B accessed to the second input terminal of the positive feedback XOR/XNOR gate meets B=VDD, the first PMOS transistor and the second PMOS transistor will be turned off at the same time, the second input signal B accessed to the drain of the first PMOS transistor cannot be normally transmitted to the source of the first PMOS transistor, the first input signal A accessed to the drain of the second PMOS transistor cannot be normally transmitted to the source of the second PMOS transistor, the first NMOS transistor and the second NMOS transistor are turned on at the same time, and the level of the XOR logic output terminal of the positive feedback XOR/XNOR gate is pulled down to a low level; when the first input signal A accessed to the first input terminal of the positive feedback XOR/XNOR gate hops to 0 from VDD and the second input terminal B accessed to the second input terminal of the positive feedback XOR/XNOR gate meets B=0, the level of the XOR logic output terminal of the positive feedback XOR/XNOR gate will be pulled down normally for a period of time along with the hopping of the first input signal A; when the first input signal A hops close to a threshold voltage VT of the first PMOS transistor and the second PMOS transistor, the level of the XOR logic output terminal of the positive feedback XOR/XNOR gate will enter into a gentle phase; when the level of the XOR logic output terminal of the positive feedback XOR/XNOR gate is pulled down below a switching threshold of an inverter formed by the third PMOS transistor and the fourth NMOS transistor, the positive feedback loop formed by the third PMOS transistor, the third NMOS transistor the fourth NMOS transistor starts to operate to enable the level of the XOR logic output terminal of the positive feedback XOR/XNOR gate to enter into a sharp pull-down phase to be pulled down to a low level to avoid threshold voltage losses, and the positive feedback XOR/XNOR gate outputs a logic signal free of threshold voltage to the output circuit to realize a full adder function; the positive feedback XOR/XNOR gate is designed based on the pass transistor logic, so that the number of transistors and the layout area are effectively reduced; the positive feedback XOR/XNOR gate adopts a positive feedback circuit based on static CMOS logic to compensate for threshold losses and reduce the delay; an internal inverter formed by the third PMOS transistor and the third NMOS transistor improves the drive capacity of the low-delay hybrid logic adder, so that the hybrid logic adder of the invention is free of threshold voltage losses and has a small delay and PDP.

To sum up, the low-delay hybrid logic adder of the invention is free of threshold voltage losses and decreases the delay and PDP, thus having a broad application prospect in high-speed calculating circuits.

What is claimed is:

1. A positive feedback XOR/XNOR gate, comprising:
a first PMOS (P-type metal-oxide-silicon) transistor, a second PMOS transistor, a third PMOS transistor, a first NMOS (N-type metal-oxide-silicon) transistor, a second NMOS transistor, a third NMOS transistor and a fourth NMOS transistor,
wherein a gate of the first PMOS transistor, a drain of the second PMOS transistor and a gate of the first NMOS transistor are connected at a first input terminal of the positive feedback XOR/XNOR gate, and a first input signal of the positive feedback XOR/XNOR gate is provided to the first input terminal of the positive feedback XOR/XNOR gate;
a source of the first PMOS transistor, a source of the second PMOS transistor, a drain of the first NMOS transistor, a gate of the third PMOS transistor, a gate of the third NMOS transistor and a drain of the fourth NMOS transistor are connected at an XOR logic output terminal of the positive feedback XOR/XNOR gate, and the XOR logic output terminal of the positive feedback XOR/XNOR gate outputs an XOR logic value;
a gate of the second PMOS transistor, a drain of the first PMOS transistor and a gate of the second NMOS transistor are connected at a second input terminal of the positive feedback XOR/XNOR gate, and a second input signal of the positive feedback XOR/XNOR gate is provided to the second input terminal of the positive feedback XOR/XNOR gate;
an operation voltage is provided to a source of the third PMOS transistor;
a drain of the third PMOS transistor, a drain of the third NMOS transistor and a gate of the fourth NMOS transistor are connected at an XNOR logic output terminal of the positive feedback XOR/XNOR gate, and the XNOR logic output terminal of the positive feedback XOR/XNOR gate outputs an XNOR logic value;
a source of the first NMOS transistor and a drain of the second NMOS transistor are connected; and
a source of the second NMOS transistor, a source of the third NMOS transistor and a source of the fourth NMOS transistor are grounded.

2. A low-delay hybrid logic adder, comprising:
a positive feedback XOR/XNOR gate of claim 1 and an output circuit for outputting a sum signal and a carry signal to an upper bit,
wherein the output circuit has a first input terminal, a second input terminal, a third input terminal, a fourth input terminal, a first output terminal and a second output terminal,
a first input signal of the low-delay hybrid logic adder is provided to the first input terminal of the positive feedback XOR/XNOR gate, a second input signal of the low-delay hybrid logic adder is provided to the second input terminal of the positive feedback XOR/XNOR gate, the first input terminal of the output circuit is connected to the XOR logic output terminal of the positive feedback XOR/XNOR gate, the second input terminal of the output circuit is connected to the XNOR logic output terminal of the positive feedback XOR/XNOR gate, the first input terminal of the positive feedback XOR/XNOR gate is a first input terminal of the low-delay hybrid logic adder, the second input terminal of the positive feedback XOR/XNOR gate is a second input terminal of the low-delay hybrid logic adder, the third input terminal of the output circuit is a carry input terminal of the low-delay hybrid logic adder, a lower-bit carry signal is provided to the carry input terminal of the low-delay hybrid logic adder, the fourth input terminal of the output circuit is connected to the second input terminal of the positive feedback XOR/XNOR gate, the first output terminal of the output circuit is a sum output terminal of the low-delay hybrid logic adder, the sum output terminal of the low-delay hybrid logic adder outputs a sum signal, the second output terminal of the output circuit is a carry output terminal of the low-delay hybrid logic adder, and the carry output terminal of the low-delay hybrid logic adder outputs the carry signal to the upper bit.

3. The low-delay hybrid logic adder according to claim 2, wherein the output circuit comprises:
a fourth PMOS transistor, a fifth PMOS transistor, a sixth PMOS transistor, a seventh PMOS transistor, a fifth NMOS transistor, a sixth NMOS transistor, a seventh NMOS transistor and an eighth NMOS transistor,
wherein a gate of the fourth PMOS transistor, a source of the fifth PMOS transistor, a gate of the seventh NMOS transistor and a gate of the seventh PMOS transistor are connected at the first input terminal of the output circuit;
a source of the fourth PMOS transistor, a source of the fifth NMOS transistor, a source of the sixth PMOS transistor, a source of the seventh NMOS transistor, a gate of the fifth PMOS transistor and a gate of the sixth NMOS transistor are connected at the third input terminal of the output circuit;
a drain of the fourth PMOS transistor, a drain of the fifth NMOS transistor, a drain of the fifth PMOS transistor and a drain of the sixth NMOS transistor are connected at the first output terminal of the output circuit;
a gate of the fifth NMOS transistor, a gate of the sixth PMOS transistor, a source of the sixth NMOS transistor and a gate of the eighth NMOS transistor are connected at the second input terminal of the output circuit;
a drain of the sixth PMOS transistor, a drain of the seventh NMOS transistor, a drain of the seventh PMOS transistor and a drain of the eighth NMOS transistor are connected at the second output terminal of the output circuit; and a source of the seventh PMOS transistor and a source of the eighth NMOS transistor are connected at the fourth input terminal of the output circuit.

4. The low-delay hybrid logic adder according to claim 2, wherein the output circuit further has a fifth input terminal and the output circuit further comprises:

a fourth PMOS transistor, a fifth PMOS transistor, a sixth PMOS transistor, a seventh PMOS transistor, an eighth PMOS transistor, a ninth PMOS transistor, a tenth PMOS transistor, an eleventh PMOS transistor, a fifth NMOS transistor, a sixth NMOS transistor, a seventh NMOS transistor, an eighth NMOS transistor, a ninth NMOS transistor, a tenth NMOS transistor, an eleventh NMOS transistor and a twelfth NMOS transistor, wherein a gate of the fourth PMOS transistor, a source of the sixth PMOS transistor and a gate of the eighth PMOS transistor are connected at the second input terminal of the output circuit;

a source of the fourth PMOS transistor, a source of the fifth NMOS transistor, a gate of the sixth NMOS transistor, a gate of the sixth PMOS transistor, a gate of the seventh PMOS transistor and a gate of the ninth NMOS transistor are connected at the third input terminal of the output circuit;

a drain of the fourth PMOS transistor, a drain of the fifth NMOS transistor, a drain of the sixth NMOS transistor, a drain of the sixth PMOS transistor, a gate of the fifth PMOS transistor and a gate of the seventh NMOS transistor are connected;

the operation voltage is provided to a source of the fifth PMOS transistor;

a drain of the fifth PMOS transistor and a drain of the seventh NMOS transistor are connected at the first output terminal of the output circuit;

a source of the seventh NMOS transistor is grounded;

the operation voltage is provided to a source of the seventh PMOS transistor, and a drain of the seventh PMOS transistor and a source of the eighth PMOS transistor are connected;

a drain of the eighth PMOS transistor, a drain of the eighth NMOS transistor, a drain of the tenth PMOS transistor, a drain of the tenth NMOS transistor, a gate of the eleventh PMOS transistor and a gate of the twelfth NMOS transistor are connected;

the operation voltage is provided to a source of the ninth PMOS transistor;

a gate of the ninth PMOS transistor and a gate of the eleventh NMOS transistor are connected at the fifth input terminal of the output circuit;

the fifth input terminal of the output circuit is connected to the first input terminal of the positive feedback XOR/XNOR gate;

a drain of the ninth PMOS transistor and a source of the tenth PMOS transistor are connected;

a gate of the tenth PMOS transistor and a gate of the tenth NMOS transistor are connected at the fourth input terminal of the output circuit;

the operation voltage is provided to a source of the eleventh PMOS transistor;

a drain of the eleventh PMOS transistor and a drain of the twelfth NMOS transistor are connected at the second output terminal of the output circuit;

a source of the twelfth NMOS transistor is grounded;

a gate of the fifth NMOS transistor, a source of the sixth NMOS transistor and a gate of the eighth NMOS transistor are connected at the first input terminal of the output circuit;

a source of the eighth NMOS transistor and a drain of the ninth NMOS transistor are connected;

a source of the ninth NMOS transistor is grounded;

a source of the tenth NMOS transistor and a drain of the eleventh NMOS transistor are connected; and a source of the eleventh NMOS transistor is grounded.

* * * * *